United States Patent [19]

Freeman

[11] 4,017,403
[45] Apr. 12, 1977

[54] ION BEAM SEPARATORS
[75] Inventor: James Harry Freeman, Abingdon, England
[73] Assignee: United Kingdom Atomic Energy Authority, England
[22] Filed: July 7, 1975
[21] Appl. No.: 593,188
[30] Foreign Application Priority Data
  July 31, 1974 United Kingdom ............ 33863/74
  July 31, 1974 United Kingdom ............ 33864/74
  July 31, 1974 United Kingdom ............ 33865/74
[52] U.S. Cl. .......................... 250/492 A; 250/298; 250/400
[51] Int. Cl.² ......................................... H05K 3/06
[58] Field of Search ....... 250/492 A, 492 B, 396 R, 250/400, 453, 427, 492 R, 298

[56] References Cited
UNITED STATES PATENTS 2,816,231 12/1957 Nygard ......................... 250/492 B
3,682,729 8/1972 Gukelberger, Jr. et al. ... 250/492 A
3,689,766 9/1972 Freeman ........................... 250/492
3,705,320 12/1972 Freeman ........................... 250/427

Primary Examiner—Alfred E. Smith
Assistant Examiner—T. N. Grigsby
Attorney, Agent, or Firm—Larson, Taylor and Hinds

[57] ABSTRACT

In an ion beam separator for use in ion implantation, the ion beam is scanned in both X and Y directions over a target. 'Y' scan is achieved by electrostatic beam deflection located close to the region where the ion beam exits from the influence of the deflecting magnet. 'X' scan is preferably provided by rectilinear target movement. Beam width or intensity control is achieved using a rotatable slit. Targets are transferred sequentially across the beam from a pack on one side and are re-stacked on the other side of the beam after exposure.

26 Claims, 10 Drawing Figures

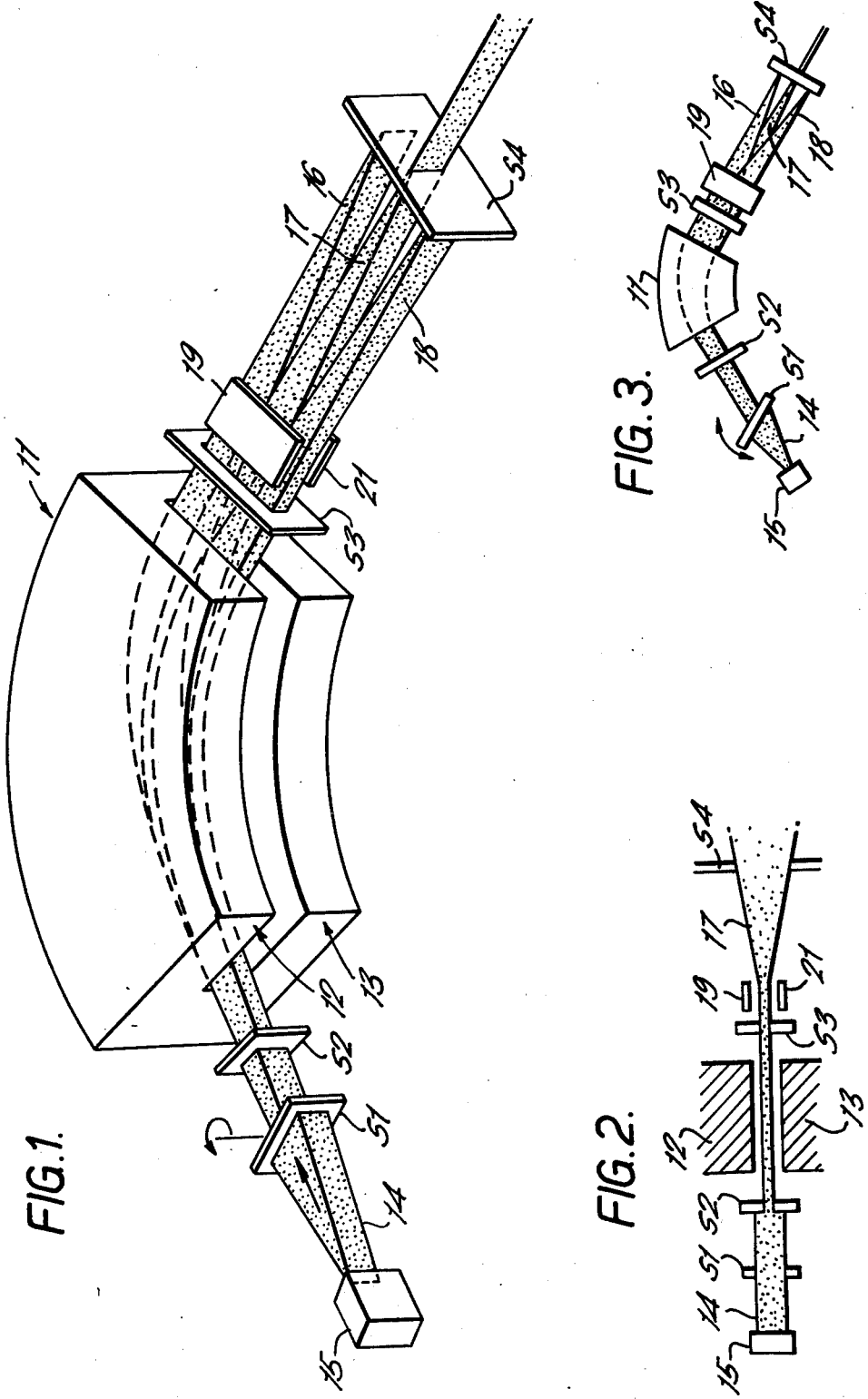

ION BEAM SEPARATORS

The invention relates to ion beam separators and more particularly to ion beam separators for providing ion beams for use in uniform doping of target material by ion implantation.

The invention provides, in one of its aspects, an ion beam separator comprising a curved in beam passageway, a deflecting magnet for deflecting an ion beam injected into the passageway, and Y scanning means located close to the region where the ion beam exits from the influence of the deflecting magnet, said Y scanning means causing the ion beam to scan in a direction perpendicular to the plane in which the beam is deflected by the deflecting magnet.

Preferably the Y scanning means operate by electrostatic deflection of the ion beam.

The ion beam separator is provided with a mass defining slit, the position of which is adjustable to select for onward transmission the ion beam of a predetermined ion mass determined by the deflection by the deflecting magnet and the position of the mass defining slit.

X scanning of the ion beam over a target material may be effected in any of a number of ways. Preferably the target material is moved at a controlled speed in the X direction through the ion beam emerging from the mass defining slit. In this way the Y scan is provided by movement of the ion beam by the aforesaid Y scanning means and X scan is provided by movement of the target material through the ion beam.

For uniform doping, or a controlled doping profile, over the surface of the target material it is necessary to control the ion beam intensity. Preferably, therefore, means is provided for detecting the intensity of the ion beam incident upon the target material and intensity control means, responsive to the detected intensity, are operative to maintain the ion beam intensity substantially constant, or to control the ion beam intensity according to a predetermined pattern linked to the X scan.

Alternatively means is provided for detecting the intensity of the ion beam incident upon the target material, and speed control means, responsive to the detected intensity, are operative to adjust the speed of X scan to secure the required constancy or intensity pattern of implanted ion dose.

In a further alternative arrangement according to the invention X scan is provided by X scanning means, which operate by electrostatic deflection of the ion beam and are positioned to operate upon the ion beam as it exits from the mass defining slit. In this case the target material is held stationary during implantation.

The invention also provides an ion beam separator comprising a curved ion beam passageway, a deflecting magnet for deflecting an ion beam injected into the passageway, and a beam width defining slit traversed by the ion beam prior to entry into the deflecting field of the said magnet, which slit is rotatable about an axis parallel with the beam height for adjusting the width of beam permitted to pass through the slit.

Preferably the said axis of rotation of the slit is located centrally of the slit and on the centre line of the required beam path for injection into the magnet field.

In one arrangement according to the invention there is provided a servo-controlled drive coupled to the slit, the servo-control being respective to a detector for ion beam intensity at the target and controlling the angular position of the slit to tend to maintain constant the detected ion beam intensity, or to vary the detected ion beam intensity in accordance with a predetermined pattern.

In use for ion-implantation of semi-conductor wafers, the wafers are mounted on plate-like carriers and are positioned in a target chamber to be bombarded by the ion beam emerging from the mass defining slit. For this purpose, the invention further provides a magazine for semi-conductor wafers comprising a first chamber for housing a pack of the wafers, a second chamber for re-housing the pack and spaced apart from the first chamber, wafer transfer means for sequential transfer of wafers from the first chamber to the second chamber and means for allowing access of an ion beam to the surface of a wafer during its transfer between the chambers.

The chambers may comprise cassettes. Alternatively they may comprise spaced apart internal parts of the magazine.

The transfer of wafers preferably takes place along a substantially rectilinear path and at a substantially constant linear velocity. Alternatively, the velocity of a wafer may be varied in accordance with any variation in the intensity of the ion beam.

The carriers of the pack may be connected to each other so that they can be folded in the manner of a fan. When this arrangement is used, each wafer-carrier is caused to change sequentially from a folded position to an unfolded position and back to a folded position during said transfer.

The transfer means may comprise a push-rod, or at least one rotary spindle with means for engaging the wafer-carriers.

The invention also comprises the combination of a magazine as set forth in the above paragraphs, in further combination with an ion beam source.

The several aforedescribed aspects of the invention are particularly suitable for use in an ion beam separator having any or all of the features described in U.S. Pat. Nos. 3,705,320 and 3,689,766 and British Patent No. 1,280,011.

However, the aforedescribed servo-controlled rotatable slit may be used as an alternative to the beam sweep stabilisation described in the U.S. Pat. No. 3,689,766.

It is to be noted that embodiment of any of the several aspects of the present invention in an ion beam separator of the kind described in U.S. Pat. No. 3,705,320 involves no major change in layout of the separator, although the reduction in beam height from about 6 centimeters to about 1 centimeter does make it possible to close down the magnet pole gap if this economy is worthwhile. With such a separator, operating at ion beam currents of the order of milliamps, the adjustable pole end portions permit adjustments of focal position from, for example, 60 or 70 centimeters from the ion exit end face of the magnet to 200 centimeters from the ion exit end face without significant loss of resolution.

A specific construction of ion beam separator embodying the invention will now be described by way of example and with reference to the accompanying drawings, in which:

FIG. 1 is a diagrammatic perspective view of the principal components of the separator;

FIG. 2 is a diagrammatic sectional view taken along the path of the ion beam;

FIG. 3 is a diagrammatic plan view of the principal components shown in FIG. 1;

Figure 4:
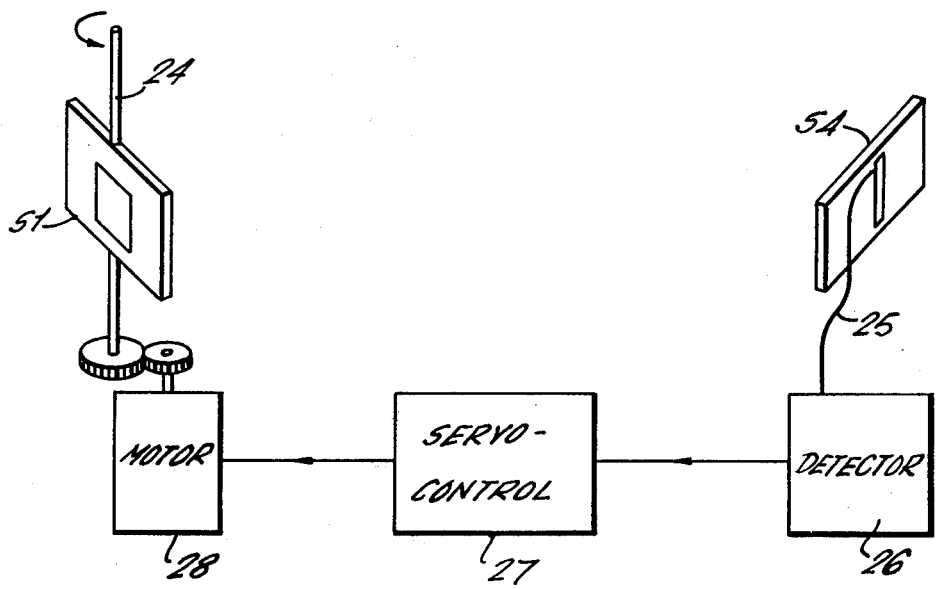
FIG. 4 is a diagrammatic block representation of a servo-control system.

To simplify the description, the drawings show the principal components in outline form. It will be appreciated that these are mounted in a vacuum enclosure and detailed constructional features of windings, power supplies, etc. are as for a conventional ion beam separator. Further, in our preferred embodiment, the magnet pole pieces are provided with rotatable end portions, as described in U.S. Pat. No. 3,705,320. These rotatable end portions are not shown in the drawings.

Referring to the drawings, the deflecting magnet 11 of the separator has pole pieces 12, 13, between which is a curved ion beam passageway. Ion beam 14 emerges from an ion source 15, which is based upon that described in British patent specification No. 916,703 and which has the property of so shaping the emergent beam that the beam appears to diverge from a virtual source of width significantly less than that of the actual extraction slit. This provides a corresponding improvement in the resolution of the separator.

The ion beam 14 from the source 15 passes through two slits S1 and S2. Slit S1 centres the beam transmitted onward to the deflection magnet 11 and also limits divergence of the beam in the horizontal plane. The slit S1 is rotatable about a central vertical axis 12 (see FIG. 4) to provide an intensity control by adjustment of beam transmission as will be described further below.

The slit S2 provides a primary definition of height of the ion beam before entering the deflecting magnet field and also sets a limit upon beam intensity.

The ion beam 14 emerging from slit S2 passes through the magnet 11 where it is deflected. The drawings illustrate separation of the ion beam into three ion beams 16, 17, and 18 of different mass ions. The deflecting magnet 11 is set up to bring these beams 16, 17 and 18 to foci at the plane of tje target (not shown in FIGS. 1 to 4, but described below with reference to FIGS. 5 to 10).

The ion beams 16, 17, 18 emerging from the exit end faces of the magnet pole pieces 12, 13 pass through a slit S3, which limits beam height and is positioned as close as practicable to the exit end faces of the pole pieces. Immediately following the slit S3 and, again, as close as practicable to the said exit end faces, is an electrostatic scanning system having deflection plates 19, 21. The form of this scanning system is conventional for producing a vertical (Y) oscillation of the beams 16, 17, 18 as best seen in FIG. 2. However, unlike known electrostatic scanning systems, the system 19, 21 is positioned close to the exit end faces of the pole pieces 12, 13 of the deflection magnet. Such an electrostatic scanning system, so positioned, is appropriate for operation with beam currents of the order 1 microamp to 100 microamps.

A slit S4 is positioned to separate out one (17) of the separated ion beams 16, 17, 18. The transmitted beam 17 impinges upon a target (not shown) in a target chamber.

X scanning of the beam 17 over the target may be effected electrostatically, in which case an electrostatic scanning system similar to that at 19, 21 is located to operate upon the beam 17 after transmission through the slit S4. For X scanning the electrostatic deflection plates would, of course, be orientated perpendicularly to the plates 19, 21.

It is, however, preferred to effect X scanning by movement of the target through the beam at a controlled speed.

Generally, a uniform dose of ions over the target will be desired and this may be achieved by controlling the intensity of the beam to maintain a constant intensity level. A detector positioned on the exit side of the mass defining slit S4 projects slightly into the beam to provide a beam current reading. This may be used in conjunction with a beam sweeping technique as described in U.S. Pat. No. 3,689,766 to maintain constant intensity. Alternatively, a servo-controlled drive to the rotatable slit S1 may be controlled by the detector as described further below.

Alternatively, where the X scan is provided by moving the target through the beam, the target drive speed can be controlled to compensate for variations in beam intensity. In this case the drive would be servo-controlled by a mechanism responsive to the detected beam current.

The beam intensity control systms described above may also be programmed to follow a predetermined intensity pattern related to the X scan position, where a particular dose profile over the target is required. This is relatively simply achieved in all the systems described with the exception of the electrostatic X scanning system.

In this example, this control of beam intensity is achieved with the system illustrated diagrammatically in FIG. 4. A probe 25 projects into a known fraction of the beam passing through the mass defining slit S4 and an output signal indicative of the beam current is provided by detector 26 to a servo-control mechanism 27. The servo-control mechanism 27 compares the indicated ion beam intensity with a reference and is arranged to drive the motor 28 accordingly so as to rotate the slit S1. As may be seen from FIG. 3 rotation of the slit S1 will cause a variation in width of beam transmitted to the magnet 11 and this, in turn, provides a control of the beam intensity emerging from the slit S4. The servo-control mechanism 27 operates so that the adjustment of the ion beam intensity by the rotation of the slit S1 is such as to tend to maintain the ion beam intensity at the target substantially constant.

Alternatively, the servo-control mechanism 27 may be programmed to control the beam intensity to follow a predetermined pattern related to the X scan position. In this way a predetermined dose profile over the target may be achieved.

FIGS. 5 to 10 illustrate target systems particularly suitable for use with the ion beam separator of this example.

In the FIGS. 5 to 10 like reference numerals refer to like components.

Figure 5:
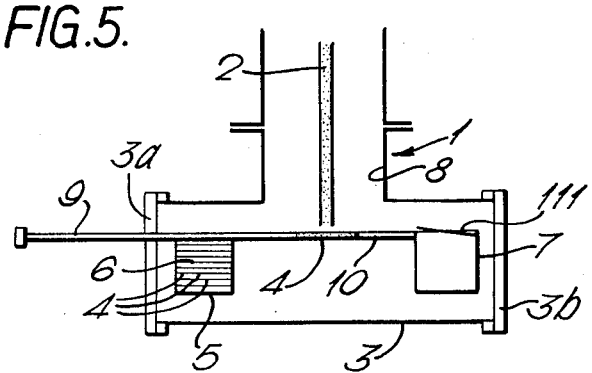
FIG. 5 is a fragmentary plan view, in medial section, of part of one form of magazine for semi-conductor wafers.
Figure 6:
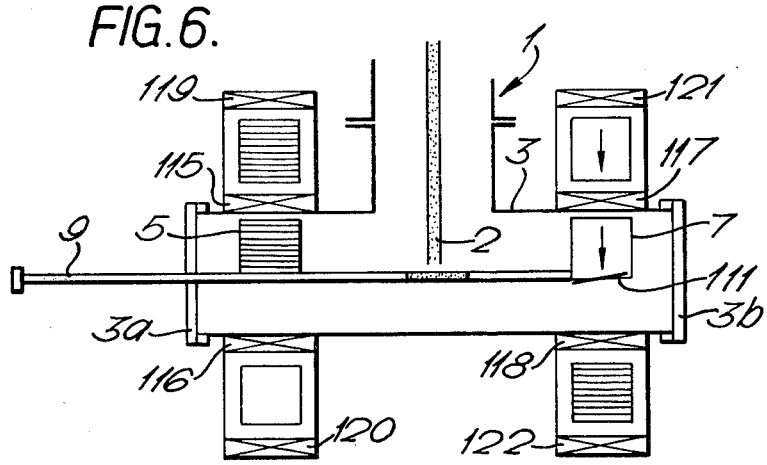
FIGS. 6, 7, 8, 9 and 10 are similar views of various modified apparatus.

With reference to FIGS. 5 and 6, reference 1 represents the target region of the ion beam separator of FIGS. 1 to 3 into which passes an ion beam 2 emerging from the mass defining slit S4. A magazine 3 is provided for semi-conductor wafers mounted on plate-like carriers 4. The magazine 3 comprises a first cassette 5 for housing a pack 6 of the carriers 4, a second cassette 7 for re-housing the pack 6, the second cassette being spaced apart from the first cassette, wafer transfer means (described hereinafter) for sequential removal of the carriers 4 with their wafers from the first cassette 5 and for re-packing the carriers in the second cassette 7 and an aperture 8 for allowing access of the ion beam 2 to the surface of a wafer during its transfer between the cassettes. The cassettes 5, 7 are removable from the magazine 3. The front, or beam-facing surface of a wafer is mounted on its carrier so that the surface cannot come into contact with any part of the apparatus.

As described above, the ion beam 2 is caused to scan a wafer in directions substantially normal to the longitudinal axis of the magazine 3. (Such scanning is termed Y scanning).

Mechanical X scanning is provided by the wafer transfer means which comprises a push-rod 9 slidably mounted in a removable end cover 3a of the magazine 3 and upper and lower parallel guide tracks 10 (only the lower track is shown) extending between the cassettes 5 and 7. The ends of the cassettes 5 and 7 adjacent the tracks 10 are open. An inclined deflecting plate 111 is disposed in the open end of the cassette 7.

In use, with the ion beam 2 switched off, the end cover 3a is removed and the cassette 5 containing the pack 6 of carriers 4 is placed in the magazine 3. A compression spring (not shown) disposed in the cassette 5 urges the pack of wafers towards the open end of the cassette. The end cover 3b is removed and the empty cassette 7 placed in position. The end covers 3a, 3b are then replaced and the magazine evacuated.

The beam 2 is switched on and the push-rod 9 is withdrawn towards the end cover 3a so as to allow a carrier 4 and its wafers to leave the cassette 5 and enter the tracks 10. The rod 9 is then pushed in to move the carrier 4 along the tracks 10 along a substantially rectilinear path, and at substantially constant linear velocity, past the beam 2 and towards the cassette 7. At the cassette 7 the plate 111 causes the wafer carrier to be deflected into the open end of the cassette.

As the wafer passes the beam 2, it is subjected to both X and Y scanning of ions implanted into the wafer. After depositing the carrier 4 and its wafer in the cassette 7 the push-rod 9 is withdrawn towards the end cover 3a to repeat the operation. When all the carriers 4 and their wafers have been transferred to the cassette 7, the beam 2 is switched off. Pressure in the magazine 3 is allowed to come up to atmosphere and the cassettes 5 and 7 removed.

FIG. 6 shows a modification wherein the magazine 3 is provided with vacuum locks 115, 116, 117 and 118 and isolating valves 119, 120, 121, 122, whereby a lock can be pre-loaded and pre-evacuated. Alternatively, by dispensing with locks 117 and 118, cassettes 5 and 7 can still be inserted into and removed from the magazine 3 without having to allow the magazine to come up to atmosphere, using the locks 119, 115 and 116, 120 for introducing both empty and full cassettes into the magazine 3.

Figure 7:
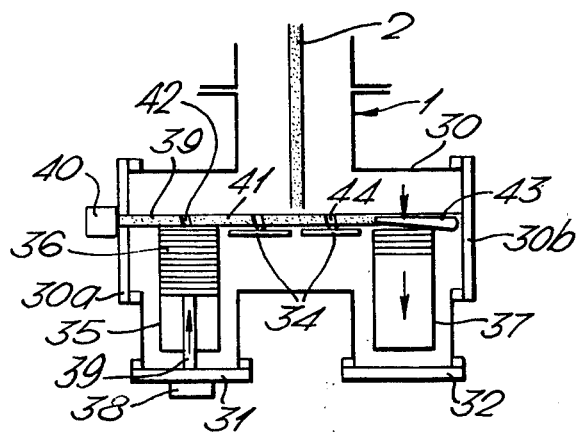

In FIG. 7, a magazine 30 has side-by-side disposed loading and unloading doors 31, 32 and removable end covers 30a, 30b. The magazine 30 comprises a first cassette 35 for housing a pack 36 of semi-conductor wafers and their carriers 34 and a second cassette 37 for re-housing the pack. The door 31 supports a linear actuator 38 having an actuating rod 39 which extends through a hole in the adjacent end of the cassette 35, and in operation, acts to displace the wafer-carriers from the cassette. The cover 30a supports a rotary actuator 40 which rotates a screw 41 defining a helical slot 42. The screw 41 extends between the ends of the cassettes 35, 37 remote from the doors 31, 32.

A tapered plate 43 is disposed across the end of the cassette 37 remote from the door 32 to define a small gap therewith large enough for a wafer-carrier 34 to enter.

The carriers 34 carry small pins 44 which engage with the helical slot 42. In operation, the screw 41 is rotated by the actuator 40, so that as a carrier 34 is urged towards the screw by the actuator rod 39, the pin 44 of the carrier engages with the slot 42 whereby the carrier is transferred along a substantially rectilinear path and at a substantially constant velocity, from the cassette 35 to the cassette 37. On reaching the cassette 37, the carrier comes into contact with the plate 43 and is deflected thereby into the cassette 37.

As each carrier 34 is transferred between the cassettes 35, 37 its wafer passes the beam 2 whereby it is subjected to both X and Y scanning of ions implanted into the wafer.

The combination of vertical (Y) electronic beam scanning and horizontal (X) mechanical traversal of a wafer results in large area uniform doping.

Figure 8:
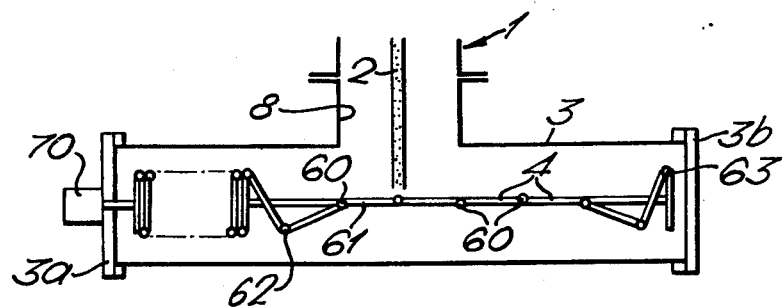

In FIG. 8, the wafer-carriers 4 are connected to each other by hinges 60 so that the wafers can be folded in the manner of a fan (as shown) to form the pack. The wafer transfer means are provided for transferring at least some of the carriers of the pack from one end of the elongated magazine 3 to the other, whereby each wafer is caused to change sequentially from a fan-folded position to an unfolded position and back to a folded position so as to form another fan-folded pack.

The wafer transfer means comprise oppositely-disposed tracks 61 (one only being shown) extending lengthwise along the axis of the magazine 3 and for most of the length thereof. The tracks 61 locate axial extensions (not shown) of hinge-pins 62 of the hinges 60, and a spring 63 is disposed between the first and second carriers and adjacent the hinges 60 thereof. The spring 63 tends to rotate the carrier of one wafer relative to the carrier to which it is attached, whereby the first carrier is rotated in one direction and the second carrier is rotated in the opposite direction. The tracks 61 have Y-like entry portions.

The magazine 3 carries an electrically-operated linear actuator 70 which applies a longitudinally-acting force against the train of wafers 4 midway along the magazine.

In use, with the ion-beam 2 switched off and the end cover 3a removed with the actuator 70 secured thereto, the pack of wafer-carriers 4 is placed in the open end of the magazine, with the axial extensions of the hinge-pins 62 of the leading wafers inserted in the adjacent ends of the tracks 61. The end cover 3a is then replaced and the apparatus 1 evacuated.

Next, the actuator 70 is operated so as to apply a force to the pack in a direction substantially parallel to the tracks 61. This force results in the carriers 4 being opened out and being moved along, one behind the other towards the end of the magazine closed by the end cover 3b.

Meanwhile the beam 2 is switched on and as each wafer moves past the aperture 8 it is subjected to both X and Y scanning of ions implanted into the wafer.

As the leading carrier 4 emerges from the ends of the tracks 61 the springs 63 carried by the said carrier results in rotary movement of the carriers so that they are folded back to their original, stacked, positions.

After all of the wafers have been ion-implanted and after they have been refolded, the beam 2 is switched off and the pack extracted from the magazine after removing the end cover 3b.

Figure 9:
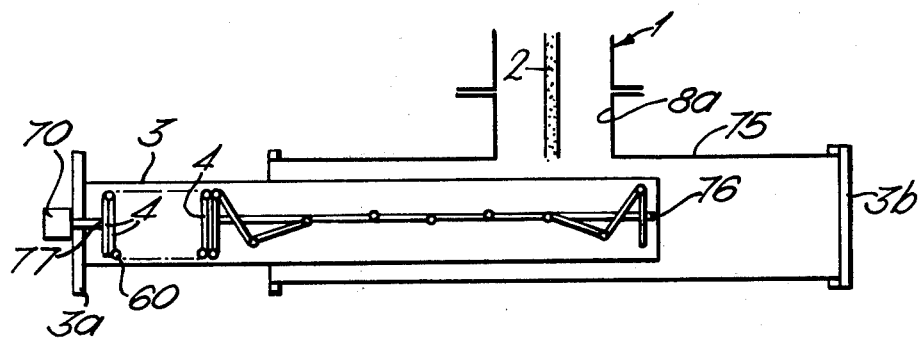

With reference to FIG. 9, in the modification shown therein, the magazine 3 is removably housed in a similarly shaped container 75 with an access aperture 8a for the ion beam 2. Also in this modification, the end wafers are anchored at 76 and 77. This results in automatic refolding of the wafer-carriers and so dispenses with the need for springs 63.

Figure 10:
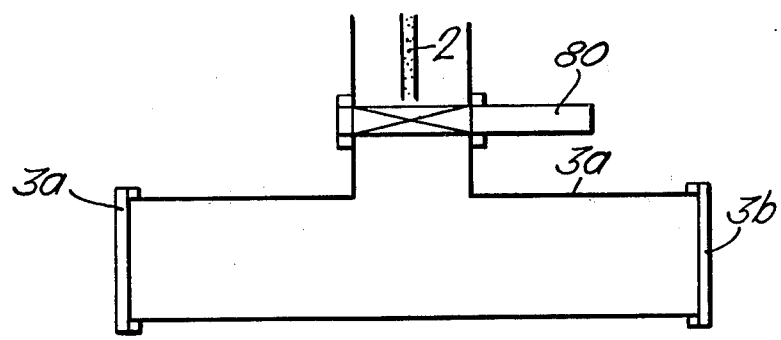

In the modification shown in FIG. 10 the magazine 3 is removably attached to the apparatus 1. An isolating valve 80 is provided which is closed when a magazine is being attached to or detached from the rest of the apparatus 1 so as to avoid pumping down of the whole apparatus on changing of a magazine.

In conventional ion-implanting apparatus using double-axis electrostatic scanning, precautions have to be taken to minimise doping non-uniformities arising from the directed flux of fast neutral particles accompanying the ion beam. These are produced in collisions between the ions and the residual gas in the vacuum system of the apparatus. They are not deflected by the scanning electrodes and may thus result in undesirable non-uniform doping of the centre of the wafer. The importance of this effect is now appreciated and commercial accelerators incorporate an additional beam deflecting system to separate the neutral component from the scanned ion beam. Since neutral particles are in fact formed along the whole path range of the ion beam, it would be desirable, for the most exacting applications, to carry out such deflection just before the target. However, because of the dimensions of the scanned ion beam, this is not practicable, and the deflection is carried out at some intermediate position.

The present invention can use such a conventional deflection system for routine applications. If the single (Y) axis scanning plates can be positioned in the fringe field of the mass analyser, thus exploiting the last stages of magnetic deflection, it might even be possible to avoid the need for such a deflection system. However, it is also apparent that if electrostatic deflection is required, it is quite practicable to deflect the beam close to the position of crossover just prior to implantation. Because of the small dimensions of the beam in the horizontal plane close to the focal point, the amount of deflection can clearly be quite small in this case.

The ion beam separator described with reference to FIGS. 1 to 4 of the foregoing example has a number of advantages for use as an ion implantation machine. The use of slits S1 and S2 to give primary definition of the ion beam in both planes gives good adjustable control of the beam current arriving at the target. This permits a high degree of differential pumping to be introduced as well as substantially reducing beam heating and outgassing effects in the analyser and target stages of the machine.

There are several important advantages arising from the idea of electrostatic Y scanning applied to the ion beam before rather than after the beam has traversed the mass defining slit. The need for a scanning extension is avoided, and consequently there is no need for additional pumps or for extra beam focussing lenses. The curvature of the ion trajectories in the magnet field reduces the problem of non-uniformity of dose arising from neutralisation of ions in the beam. It will be appreciated that neutralised ions present in the beam and moving towards the target are not deflected by an electrostatic scanning system. The number of neutral ions present in the beam is dependent upon the length of undeviated beam path through which the beam has traversed. One technique for diminishing the number of neutral ions striking the target with a non-uniform distribution is to deflect the beam electrostatically just prior to its passage through the electrostatic scanning system. The need for such a separate deflection is avoided in the foregoing example, which effectively makes use of the curved trajectories in the main deflection magnet for reducing the number of neutral ions that pass through the Y scanning system directed towards the target.

The invention is not restricted to the details of the foregoing example. For instance, instead of using this beam scanning concept with an earthed target chamber, it is envisaged that the accelerating electrode assembly described in U.S. Pat. No. 3,689,766 (see FIG. 2) can be modified to accommodate the tall scanned beam in a high-voltage target chamber. Current monitoring would be relatively simple in such a system since the actual beam used for implanting could be measured at earth potential as it is over-scanned beyond the edges of the mass defining slit.

I claim:

1. An ion beam separator comprising a curved ion beam passageway, a deflecting magnet for deflecting an ion beam injected into the passageway, and a beam width defining slit traversed by the ion beam prior to entry into the deflecting field of the said magnet, which slit is rotatable about an axis parallel with the beam height for adjusting the width of beam permitted to pass through the slit.

2. An ion beam separator as claimed in claim 1, wherein the said axis of rotation of the slit is located centrally of the slit and on the centre line of the required beam path for injection into the magnet field.

3. An ion beam separator as claimed in claim 2, wherein there is provided a servo-controlled drive coupled to the slit, the servo-control being responsive to a detector for ion beam intensity at the target and controlling the angular position of the slit to control the detected ion beam intensity in accordance with a predetermined requirement.

4. A magazine for semiconductor wafers comprising a first chamber for housing a pack of the wafers, a second chamber for rehousing the pack and spaced apart from the first chamber, wafer transfer means for sequential transfer of wafers from the first chamber to the second chamber and means for allowing access of an ion beam to the surface of a wafer during its transfer between the chambers.

5. A magazine for semiconductor wafers as claimed in claim 4, wherein the chambers comprise cassettes.

6. A magazine for semiconductor wafers as claimed in claim 4, wherein the chambers comprise spaced apart internal parts of the magazine.

7. A magazine for semiconductor wafers as claimed in claim 4, wherein the transfer of wafers takes place along a substantially rectilinear path and at a substantially constant linear velocity.

8. A magazine for semiconductor wafers as claimed in claim 4, wherein the velocity of a wafer is varied in accordance with variation in the intensity of the ion beam.

9. A magazine for semiconductor wafers as claimed in claim 4, wherein the carriers of the pack are connected to each other so that they can be folded in the manner of a fan.

10. A magazine for semiconductor wafers as claimed in claim 4 wherein the transfer means comprise a push-rod, or at least one rotary spindle with means for engaging the wafer-carriers.

11. An ion beam separator comprising a curved ion beam passageway, a deflection magnet for deflecting an ion beam injected into the passageway, Y scanning means, and a mass defining slit, the position of which is adjustable to select for onward transmission the ion beam of a predetermined ion mass determined by the deflection by the deflecting magnet and the position of the mass defining slit, the said Y scanning means being located adjacent the position where the ion beam exits from the influence of the deflecting magnet and between the said deflecting magnet and the mass defining slit, and the said Y scanning means causing the ion beam to scan in a direction perpendicular to the plane in which the beam is deflected by the deflecting magnet.

12. An ion beam separator as claimed in claim 11, wherein the Y scanning means operate by electrostatic deflection of the ion beam.

13. An ion beam separator as claimed in claim 11, wherein to provide X scanning of the ion beam over a target material, the target material is moved at a controlled speed in the X direction through the ion beam emerging from the mass defining slit.

14. An ion beam separator as claimed in claim 11, wherein means is provided for detecting the intensity of the ion beam incident upon the target material and intensity control means, responsive to the detected intensity, are operative to control the detected ion beam intensity in accordance with a predetermined requirement.

15. An ion beam separator comprising a curved ion beam passageway, a deflecting magnet for deflecting an ion beam injected into the passageway, and Y scanning means located close to the region where the ion beam exits from the influence of the deflecting magnet, said Y scanning means causing the ion beam to scan in a direction perpendicular to the plane in which the beam is deflected by the deflecting magnet, said separator further comprising means for detecting the intensity of the ion beam incident upon a target material, and speed control means, responsive to the detected intensity, for adjusting the speed of X scan to secure the required characteristics of implanted ion dose.

16. An ion beam separator as claimed in claim 15, wherein X scan is provided by X scanning means, which operate by electrostatic deflection of the ion beam and are positioned to operate upon the ion beam as it exits from the mass defining slit.

17. An ion beam separator comprising a curved ion beam passage, a deflecting magnet for deflecting an ion beam injected into the passageway, and Y scanning means located close to the region where the ion beam exits from the influence of the deflecting magnet, said Y scanning means causing the ion beam to scan in a direction perpendicular to the plane in which the beam is deflected by the deflecting magnet, said separator further comprising a beam width defining slit traversed by the ion beam prior to entry into the deflecting field of the said magnet, which slit is rotatable about an axis parallel with the beam height for adjusting the width of beam permitted to pass through the slit.

18. An ion beam separator as claimed in claim 17, wherein the said axis of rotation of the slit is located centrally of the slit and on the centre line of the required beam path for injection into the magnet field.

19. An ion beam separator as claimed in claim 18, wherein there is provided a servo-controlled drive coupled to the slit, the servo-control being responsive to a detector for ion beam intensity at the target and controlling the angular position of the slit to tend to maintain constant the detected ion beam intensity, or to vary the detected ion beam intensity in accordance with a predetermined pattern.

20. An ion beam separator comprising a curved ion beam passageway, a deflecting magnet for deflecting an ion beam injected into the passageway, and Y scanning means located close to the region where the ion beam exits from the influence of the deflecting magnet, said Y scanning means causing the ion beam to scan in a direction perpendicular to the plane in which the beam is deflected by the deflecting magnet, said separator further comprising a magazine for semiconductor wafers comprising a first chamber for housing a pack of the wafers, a second chamber for rehousing the pack and spaced apart from the first chamber, wafer transfer means for sequential transfer of wafers from the first chamber to the second chamber and means for allowing access of an ion beam to the surface of a wafer during its transfer between the chambers.

21. An ion beam separator as claimed in claim 20, wherein the chambers comprise cassettes.

22. An ion beam separator as claimed in claim 20, wherein the chambers comprise spaced apart internal parts of the magazine.

23. An ion beam separator as claimed in claim 20, wherein the transfer of wafers takes place along a substantially rectilinear path and at a substantially constant linear velocity.

24. An ion beam separator as claimed in claim 20, wherein the velocity of a wafer is varied in accordance with variation in the intensity of the ion beam.

25. An ion beam separator as claimed in claim 20, wherein the carriers of the pack are connected to each other so that they can be folded in the manner of a fan.

26. An ion beam separator as claimed in claim 20, wherein the transfer means comprise a push-rod, or at least one rotary spindle with means for engaging the wafer-carriers.

* * * * *